United States Patent [19]

Maan

[11] Patent Number: 4,689,807

[45] Date of Patent: Aug. 25, 1987

[54] LINKED CELL DISCHARGE DETECTOR HAVING IMPROVED RESPONSE TIME

[75] Inventor: Mohammed N. Maan, Houston, Tex.

[73] Assignee: Texas Instruments Incorporated, Dallas, Tex.

[21] Appl. No.: 795,380

[22] Filed: Nov. 6, 1985

[51] Int. Cl.$^4$ ............................................. G11C 19/28
[52] U.S. Cl. ...................................... 377/57; 377/59; 307/607; 307/246
[58] Field of Search ...................... 377/57, 58, 59, 60; 307/246, 530, 607; 340/728, 747, 789

[56] References Cited

U.S. PATENT DOCUMENTS

| | | | |
|---|---|---|---|
| 3,723,763 | 3/1973 | Udovic | 307/246 |
| 3,786,360 | 1/1974 | Kawa | 307/246 |
| 3,883,862 | 5/1975 | Nishizawa et al. | 340/789 |
| 4,157,558 | 6/1979 | Weckler | 377/57 |
| 4,223,233 | 9/1980 | Cappon et al. | 377/57 |
| 4,242,678 | 12/1980 | Somerville | 340/728 |
| 4,348,601 | 9/1982 | Kitamura | 307/530 |
| 4,456,841 | 6/1984 | Lam et al. | 307/530 |
| 4,535,465 | 8/1985 | Leach | 377/117 |
| 4,570,233 | 2/1986 | Yan et al. | 340/747 |

OTHER PUBLICATIONS

"Field-Effect Transistor Push-Pull Driver" by R. J. Daniels et al. IBM Technical Disclosure Bulletin vol. 17, No. 10, Mar. 1975.

Primary Examiner—Stanley D. Miller
Assistant Examiner—K. Ohralik
Attorney, Agent, or Firm—Leo N. Heiting; N. Rhys Merrett; Melvin Sharp

[57] ABSTRACT

The present invention enables improved response time in a linked cell discharge detection device by providing additional discharge paths when indicated to speed discharge of circuit nodes in a plurality of detection cells. A circuit node is periodically precharged by connection to a voltage source. This node is selectively discharged in accordance with at least one input signal. An output device connected to the circuit node generates an output indicative of the state of the charge on the circuit node. An additional discharge device which is responsive to the output device provides an additional discharge path when the output signal indicates a charge on the circuit node less than a predetermined magnitude. This additional discharge path speeds up the complete discharge of the circuit node. A set of linked cells having connected circuit nodes may thus be assured of reaching a stable state whenever any one of the nodes is selectively discharged by a rippling of the application of these additional discharge devices. In one preferred embodiment the circuit nodes of a number of such detection bit cells are selectively connected in groups in accordance with a size input. This technique is advantageously employed in detecting a code of all "0's" when the code length is variable.

8 Claims, 16 Drawing Figures

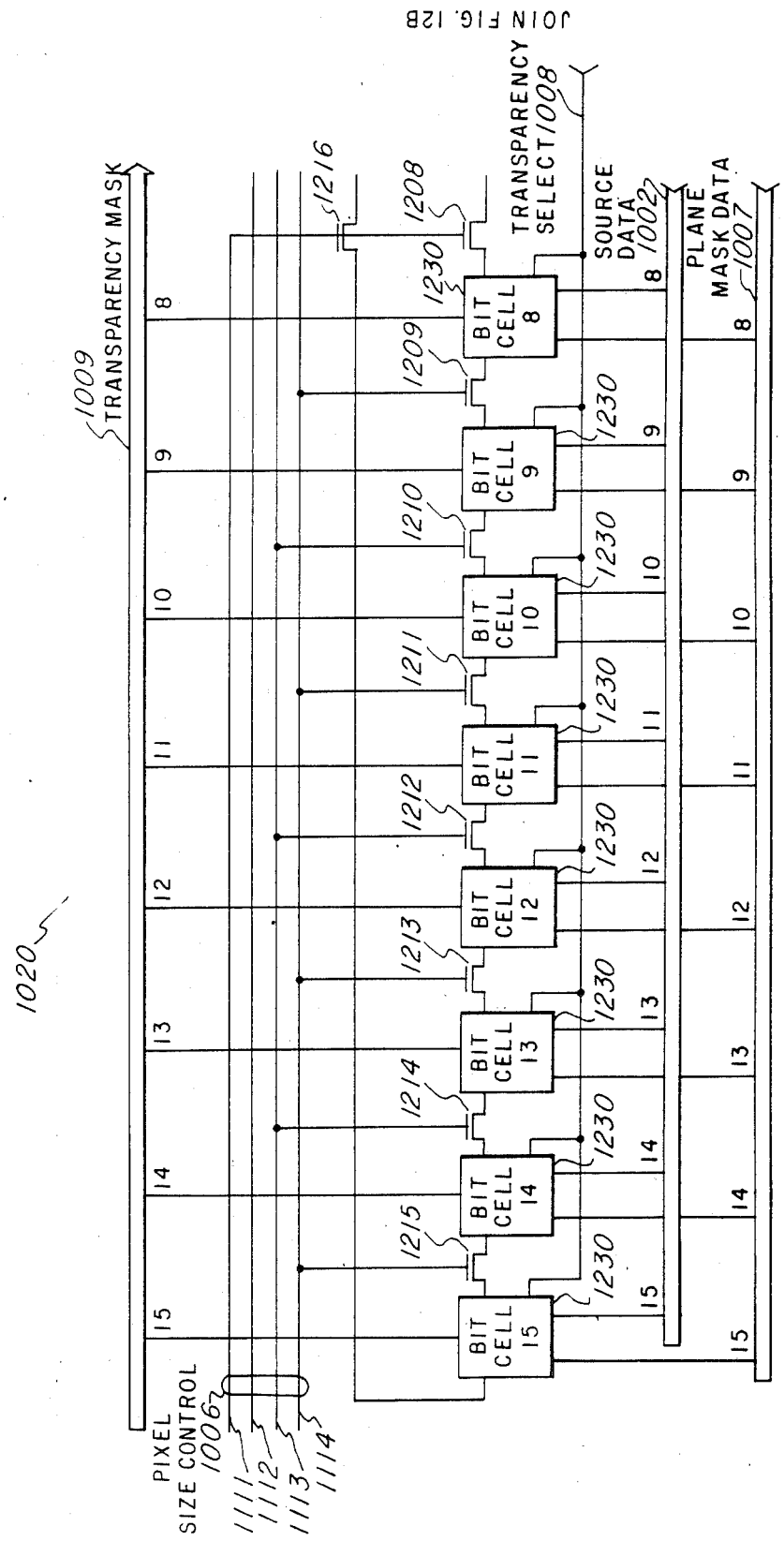

LINKED CELL DISCHARGE DETECTOR HAVING IMPROVED RESPONSE TIME

CROSS REFERENCE TO RELATED APPLICATIONS

The present application is related to U.S. patent application Ser. No. 790,299 filed Oct. 22, 1985, entitled "Graphics Data Processing Apparatus Having Pixel to Window Compare Capability" by Karl M. Guttag, Michael D. Asal and Mark F. Novak, U.S. patent application Ser. No. 790,293 filed Oct. 22, 1985, entitled "Logic Circuit for a Pixel to Window Compare Capability" by Richard Simpson and Dyson Wilkes, U.S. patent application Ser. No. 795,158 filed Nov. 5, 1985, entitled "Graphics Data Processing Apparatus for Graphic Image Operations upon Data of Independently Selectable Pitch" by Karl M. Guttag, Michael D. Asal and Mark F. Novak, U.S. patent application Ser. No. 795,383 filed Nov. 6, 1985, entitled "Graphics Processing Apparatus Having Color Expand Operation for Drawing Color Graphics from Monochrome Data" by Karl M. Guttag, Michael D. Asal and Mark F. Novak, U.S. patent application Ser. No. 795,382 filed Nov. 6, 1985, entitled "Graphics Data Processing Apparatus Having Image Operations with Transparent Color Having a Selectable Number of Bits" by Karl M. Guttag, Michael D. Asal and Thomas Preston, U.S. patent application Ser. No. 804,204 filed Dec. 3, 1985, entitled "Graphics Processing Apparatus Having Instruction which Operates Separately on X and Y Coordinates of Pixel Location Registers" by Karl M. Guttag, Michael D. Asal, Neil Tebbutt and Mark F. Novak, U.S. patent application Ser. No. 804,203 filed Dec. 3, 1985, entitled "Graphics Data Processing Apparatus with Draw and Advance Operation" by Karl M. Guttag, Michael D. Asal, Neil Tebbutt, Jerry R. Van Aken and Mark F. Novak, U.S. patent application Ser. No. 821,375 filed Jan. 22, 1985, entitled "Data Processing System with Variable Memory Bank Selection" by Andrew Heilveil, U.S. patent application Ser. No. 821,641 filed Jan. 23, 1985, entitled "Programmable Data Processing System and Apparatus for Executing both General Purpose Instructions and Special Purpose Graphic Instructions" by Karl M. Guttag, Kevin C. McDonough and Surgio Maggi, U.S. patent application Ser. No. 821,634 filed Jan. 23, 1985, entitled "Data Processing Apparatus and System Having Memory Accesses on Selectably Variable Field Sizes" by Michael D. Asal, Karl M. Guttag, Jerry R. Van Aken, Neil Tebbutt and Mark F. Novak, U.S. patent application Ser. No. 821,644 filed Jan. 23, 1985, entitled "Memory Access Controller Having Variable Priority" by Thomas Preston, Michael D. Asal and Karl M. Guttag and U.S. patent application Ser. No. 821,667 filed Jan. 23, 1985, entitled "Graphics Data Processing Apparatus Having Nonlinear Saturating Operations on Multibit Color Data" by Karl M. Guttag, Michael D. Asal and Mark F. Novak.

BACKGROUND OF THE INVENTION

The present invention relates to the field of computer graphics. In particular, this invention relates to the field of bit mapped computer graphics in which the computer memory stores data for each individual picture element or pixel of the display at memory locations that correspond to the location of that pixel on the display. The field of bit mapped computer graphics has benefited greatly from the lowered cost per bit of dynamic random access memory (DRAM). The lowered cost per bit of memory enables larger and more complex displays to be formed in the bit mapped mode.

The reduction in the cost per bit of memory and the consequent increase in the capacity of bit mapped computer graphics has led to the need for processing devices which can advantageously use the bit mapped memory in computer graphics applications. In particular, a type of device has arisen which includes the capacity to draw simple figures, such as lines and circles, under the control of the main processor of the computer. In addition, some devices of this type include a limited capacity for bit block transfer (known as BIT-BLT or raster operation) which involves the transfer of image data from one portion of memory to another, together with logical or arithmetic combinations of that data with the data at the destination location within the memory.

These bit-map controllers with hard wired functions for drawings lines and performing other basic graphics operations represent one approach to meeting the demanding performance requirements of bit maps displays. The built-in algorithms for performing some of the most frequently used graphics operations provides a way of improving overall system performance. However, a useful graphics system often requires many functions in addition to those few which are implemented in such a hard wired controller. These additional required functions must be implemented in software by the primary processor of the computer. Typically these hard wired bit-map controllers permit the processor only limited access to the bit-map memory, thereby limiting the degree to which software can augment the fixed set of functional capacities of the hard wired controller. Accordingly, it would be highly useful to be able to provide a more flexible solution to the problem of controlling the contents of the bit mapped memory, either by providing a more powerful graphics controller or by providing better access to this memory by the system processor, or both.

SUMMARY OF THE INVENTION

The present invention relates to improvements in a graphics data processing apparatus which performs a transparency function when forming a combination of two graphic images. In the combination of two graphic images, called a bit block transform or raster operation, color codes which represent each pixel of the two images are combined. This combination may be a logical operation such as AND or OR or an arithmetic operaton such as addition or subtraction. In a typical application of this technique a source pixel array which is stored in a memory is combined with a destination pixel array which is stored in a portion of memory that controls the image to be displayed and the combined image is stored in the portion of memory formerly occupied by the destination array. By this means the image displayed may be changed through these raster operations.

In accordance with a refinement of this technique, the source pixel is permitted to have a special type of color code which indicates transparency. The combination of a transparent color code from the source array with any color code from the corresponding pixel of the destination array yields the color code of the destination pixel, regardless of the type of combination. This technique enables the storage of various figures such as icons in a portion of memory which is not displayed for placement within selected portions of the display by combination with a portion of the image being displayed. The use of a transparency color code enables these figures to be formed in arbitrary forms without limitation to rectangular forms. This is because those portions of the figure which are not active can be formed in the transparent color code.

The improvement of the present invention lies in the flexibility of the graphics data processing apparatus to be capable of operating on pixels represented by differing numbers of bits. In particular, the graphics data processing apparatus of the present invention is capable of detecting a transparent color code of a selected length. The graphics data processing apparatus of the present invention employs a pixel size memory register which stores a number equal to the number of bits representing each pixel. A transparency detection logic circuit receives the color codes corresponding to the sorce image array and is responsive to the pixel size data to detect transparent color codes of the selected length. Based upon the detection or nondetection of transparent color codes, a transparency select logic circuit selects either the destination data or the combined data in accordance with the raster operation selected.

In the preferred embodiment the transparency detection logic circuit employs a set of bit cells equal in number to the size of the data word employed by the graphics data processing apparatus. These bit cells are coupled in differing combinations dependent upon the pixel size data. These bit cells are coupled into groups equal in size to the pixel size data. These sets of bit cells are used to detect the transparent color codes. Depending upon whether the transparency detection logic circuit detects or does not detect the transparent color codes, a set of "0" bits or a set of "1" bits are generated. Each of these sets of bits are equal in number to the pixel size indicated by the pixel size data. These sets of bits are then applied to the transparency select logic circuit to select the combined data or the destination data.

The sets of bit cells coupled together in groups equal to the pixel size data become NAND gates. In the preferred embodiment the transparent color code is a set of all "0's". The existence of any "1" bit in a pixel color code indicates that that particular pixel is not transparent. This is sensed by coupling the bit cells into groups equal in number to the pixel size. Any "1" bit within the color code of a particular bit within one of these groups of bit cells causes all of the cells coupled in that group to generate a "1" output. Only if all of the bits of that pixel are "0" will the output of each bit cell be equal to "0".

In the preferred embodiment a special sensing circuit is employed to speed up the process of sensing any "1" bit. A "1" bit is detected by the discharge of a precharged circuit node within each bit cell. The absence of any such charge is detected as a nontransparent pixel color code. Because there could be only a single "1" bit within the particular color code and because the pixel size could be as large as 16 bits in the preferred embodiment, a substantial period is required to assure that all of the nodes are discharged in the worst case. In the preferred embodiment, each bit cell includes a sensor which detects the reduction in voltage caused by the discharge of the node of an adjacent bit cell. When such a discharge is detected, an additional discharge path within the sensing bit cell is enabled. The voltage reduction caused by this additional discharge path is in turn sensed by the other adjacent bit cell which also enables an additional discharge path. By this means the process of nontransparent detection is speeded by increasing the current capacity of the discharge paths.

The present invention is technically advantageous because it enables greater flexibility in transparency functions. The detection of transparency is not hardwired to any particular color code length but is selectable. This enables a single graphics data processing apparatus capable of performing a greater variety of tasks. A single such graphics data processing apparatus could thus be used in a greater variety of applications than previously possible. This increased flexibility enables greater volumes of a single graphics data processing apparatus to be produced with the consequent reduction in the unit cost of each such apparatus. In addition, within a single application the number of bits per pixel could be varied without adversely affecting the capability of performing transparency operations. Thus a single apparatus can perform a greater variety of functions than otherwise possible.

BRIEF DESCRIPTION OF THE DRAWINGS

These and other objects of the resent invention will be readily understood from the following description, taken in conjunction with the drawings in which:

FIGS. 12A and 12B illustrate the details of the transparency detection logic illustrated in FIG. 10;

DETAILED DESCRIPTION OF THE PREFERRED EMBODIMENT

Figure 1:
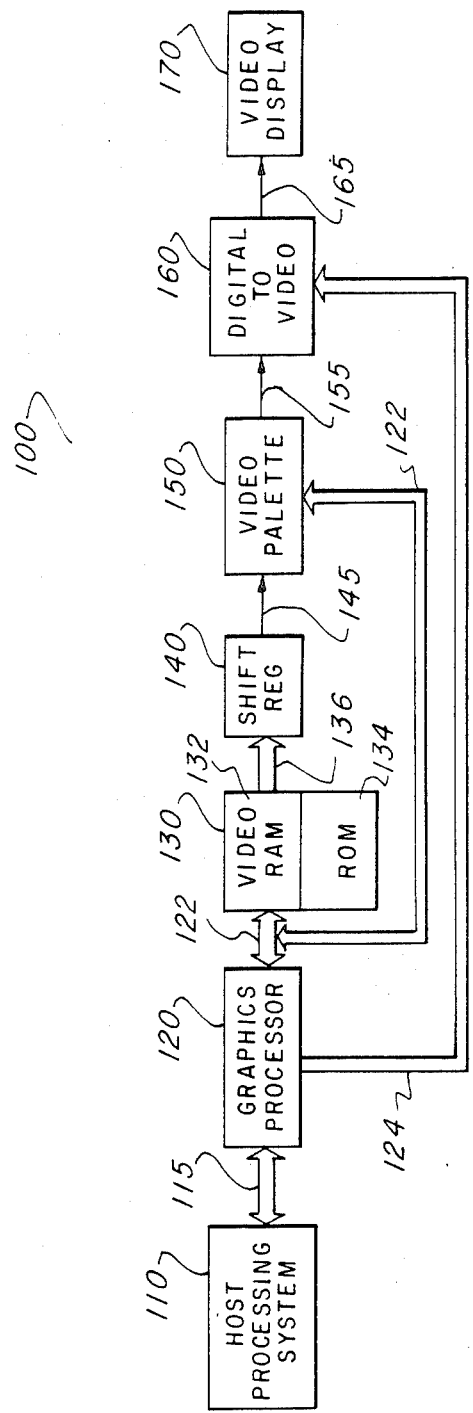
FIG. 1 illustrates a block diagram of a computer with graphics capability constructed in accordance with the principles of the present invention.

FIG. 1 illustrates a block diagram of graphics computer system 100 which is constructed in accordance with the principles of the present invention. Graphics computer system 100 includes host processing system 110, graphics processor 120, memory 130, shift register 140, video palette 150, digital to video converter 160 and video display 170.

Host processing system 110 provides the major computational capacity for the graphics computer system 100. Host processing system 110 preferably includes at least one microprocessor, read only memory, random access memory and assorted peripheral devices for forming a complete computer system. Host processing system 110 preferably also includes some form of input device, such as a keyboard or a mouse, and some form of long term storage device such as a disk drive. The details of the construction of host processing system 110 are conventional in nature and known in the art, therefore the present application will not further detail this element. The essential feature of host processing system 110, as far as the present invention is concerned, is that host processing system 110 determines the content of the visual display to be presented to the user.

Graphics processor 120 provides the major data manipulation in accordance with the pesent invention to generate the particular video display presented to the user. Graphics processor 120 is bidirectionally coupled to host processing system 110 via host bus 115. In accordance with the pesent invention, graphics processor 120 operates as an independent data processor from host processing system 110, however, it is expected that graphics processor 120 is responsive to requests from host processing system 110 via host but 115. Graphics processor 120 further communicates with memory 130, and video palette 150 via video memory bus 122. Graphics processor 120 controls the data stored within video RAM 132 via video memory bus 122. In addition, graphics processor 120 may be controlled by programs stored in either video RAM 132 or read only memory 134. Read only memory 134 may additionally include various types of graphic image data, such as alphanumeric characters in one or more font styles and frequently used icons. In addition, graphics processor 120 via video memory bus 122 controls the data stored within video palette 150. This feature will be further disclosed below. Lastly, grahics processor 120 controls digital to video converter 160 via video control bus 124. Graphics processor 120 may control the line length and the number of lines per frame of the video image presented to the user by control of digital to video converter 160 via video control bus 124.

Video memory 130 includes video RAM 132 which is bidirectionally coupled to graphics processor 120 via video memory bus 122 and read only memory 134. As previously stated, video RAM 132 includes the bit mapped graphics data which controls the video image presented to the user. This video data may be manipulated by graphics processor 120 via video memory bus 122. In addition, the video data corresponding to the current display screen is output from video RAM 132 via video output bus 136. The data from video output bus 136 corresponds to the picture element to be presented to the user. In the preferred embodiment video RAM 132 is formed of a plurality of TMS4161 64K dynamic random access integrated circuits available from Texas Instruments Corporation, the assignee of the present application. The TMS4161 integrated circuit includes dual ports, enabling display refresh and display update to occur without interference.

Shift register 140 receives the video data from video RAM 130 and assembles it into a display bit stream. In accordance with the typical arrangement of video random access memory 132, this memory consists of a bank of several separate random access memory integrated circuits. The output of each of these integrated circuits is typically only a single bit wide. Therefore, it is necessary to assemble data from a plurality of these circuits in order to obtain a sufficiently high data output rate to specify the image to be presented to the user. Shift register 140 is loaded in parallel from video output bus 136. This data is output in series on line 145. Thus shift register 140 assembles a display bit stream which provides video data at a rate high enough to specify the individual dots within the raster scanned video display.

Video palette 150 receives the high speed video data from shift register 140 via bus 145. Video palette 150 also receives data from graphics processor 120 via video memory bus 122. Video palette 150 converts the data received on bus 145 into a video level output on bus 155. This conversion is achieved by means of a lookup table which is specified by graphics processor 120 via video memory bus 122. The output of video palette 150 may comprise color hue and saturation for each picture element or may comprise red, green and blue primary color levels for each pixel. The table of conversion from the code stored within video memory 132 and the digital levels output via bus 155 is controlled from graphics processor 120 via video memory bus 122.

Digital to video converter 160 receives the digital video information from video palette 150 via bus 155. Digital to video converter 160 is controlled by graphics processor 120 via video control bus 124. Digital to video converter 160 serves to convert the digital output of video palette 150 into the desired analog levels for application to video display 170 via video output 165. Digital to video converter 160 is controlled for a specification of the number of pixels per horizontal line and the number of lines per frame, for example, by graphics processor 120 via video controller bus 124. Data within graphics processor 120 controls the generation of the synchronization and blanking signals and the retrace signals by digital to video converter 160. These portions of the video signal are not specified by the data stored within video memory 132, but rather form the control signals necessary for specification of the desired video output.

Lastly, video display 170 receives the video output from digital to video converter 160 via video output line 165. Video display 170 generates the specified video image for viewing by the operator of graphics computer system 100. It should be noted that video palette 150, digital to video converter 160 and video display 170 may operate in accordance to two major video techniques. In the first, the video data is specified in terms of color hue and saturation for each individual pixel. In the other technique, the individual primary color levels of red, blue and green are specified for each individual pixel. Upon determination of the design choice of which of these major techniques to be employed, video palette 150, digital to converter 160 and video display 170 must be constructed to be compatible to this technique. However, the principles of the pesent invention in regard to the operation of graphics processor 120 are unchanged regardless of the particular design choice of video technique.

Figure 2:
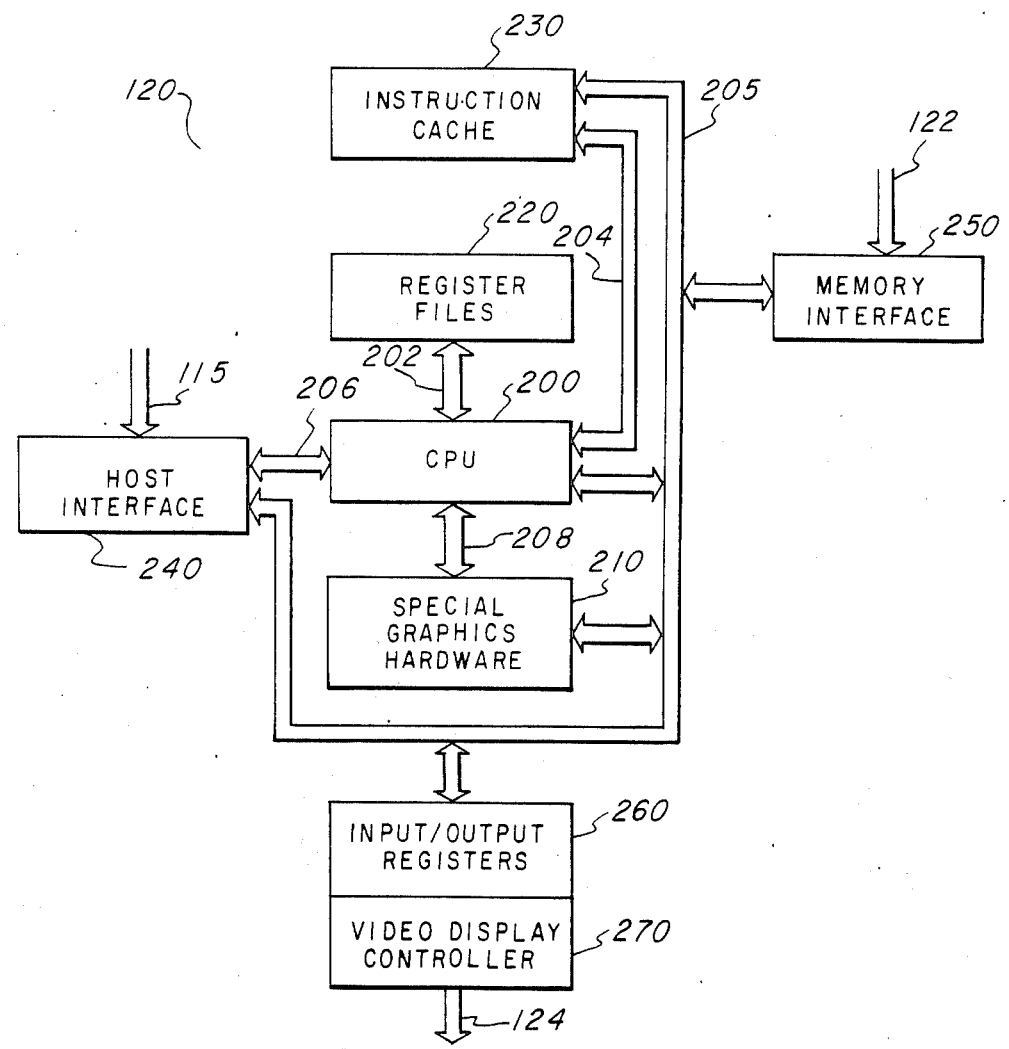
FIG. 2 illustrates the block diagram of a preferred embodiment of the graphics processing circuit of the present invention.

FIG. 2 illustrates graphics processor 120 in further detail. Graphics processor 120 includes central processing unit 200, special graphics hardware 210, register files 220, instruction cache 230, host interface 240, memory interface 250, input/output registers 260 and video display controller 270.

The heart of graphics processor 120 is central processing unit 200. Central processing unit 200 includes the capacity to do general purpose data processing including a number of arithmetic and logic operations normally included in a general purpose central processing unit. In addition, central processing unit 200 controls a number of special purpose graphics instructions, either alone or in conjunction with special graphics hardware 210.

Graphics processor 120 includes a major bus 205 which is connected to most parts of graphics processor 120 including the central processing unit 200. Central processing unit 200 is bidirectionally coupled to a set of register files, including a number of data registers, via bidirectional register bus 202. Register files 220 serve as the depository of the immediately accessible data used by central processing unit 200. As will be further detailed below, register files 220 includes in addition to general purpose registers which may be employed by central processing unit 200, a number of data registers which are employed to store implied operands for graphics instructions.

Central processing unit 200 is connected to instruction cache 230 via instruction cache bus 204. Instruction cache 230 is further coupled to general bus 205 and may be loaded with instruction words from the video memory 130 via video memory bus 122 and memory interface 250. The purpose of instruction cache 230 is to speed up the execution of certain functions of central processing unit 200. A repetitive function or function that is used often within a particular portion of the program executed by central processing unit 200 may be stored within instruction cache 230. Access to instruction cache 230 via instruction cache bus 204 is much faster than access to video memory 130. Thus, the program executed by central processing unit 200 may be speeded up by preliminarily loading the repeated or often used sequences of instructions within instruction cache 230. Then these instructions may be executed more rapidly because they may be fetched more rapidly. Instruction cache 230 need not always contain the same sets of instructions, but may be loaded with a particular set of instructions which will be often used within a particular portion of the program executed by central processing unit 200.

Host interface 240 is coupled to central processing unit 200 via host interface bus 206. Host interface 240 is further connected to the host processing system 110 via host system bus 115. Host interface 240 serves to control the communication between the host processing system 110 and the graphics processor 120. Host interface 240 controls the timing of data transfer between host processing system 110 and graphics processor 120. In this regard, host interface 240 enables either host processing system 110 to interrupt graphics processor 120 or vice versa enabling graphics processor 120 to interrupt host processing system 110. In addition, host interface 240 is coupled to the major bus 205 enabling the host processing system 110 to control directly the data stored within memory 130. Typically host interface 240 would communicate graphics requests from host processing system 110 to graphics processor 120, enabling the host system to specify the type of display to be generated by video display 170 and causing graphics processor 120 to perform a desired graphic function.

Central processing unit 200 is coupled to special graphics hardware 210 via graphics hardware bus 208. Special graphics hardware 210 is further connected to major bus 205. Special graphics hardware 210 operates in conjunction with central processing unit 200 to perform special graphic processing operations. Central processing unit 200, in addition to its function of providing general purpose data processing, controls the application of the special graphics hardware 210 in order to perform special purpose graphics instructions. These special purpose graphics instructions concern the manipulation of data within the bit mapped portion of video RAM 132. Special graphic hardware 210 operates under the control of central processing unit 200 to enable particular advantageous data manipulations regarding the data within video RAM 132.

Memory interface 250 is coupled to major bus 205 and further coupled to video memory bus 122. Memory interface 250 serves to control the communication of data and instructions between graphics processor 120 and memory 130. Memory 130 includes both the bit mapped data to be displayed via video display 170 and instructions and data necessary for the control of the operation of graphics processor 120. These functions include control of the timing of memory access, and control of data and memory multiplexing. In the preferred embodiment, video memory bus 122 includes multiplexed address and data information. Memory interface 250 enables graphics processor 120 to provide the proper output on video memory bus 122 at the appropriate time for access to memory 130.

Graphics processor 120 lastly includes input/output registers 260 and video display controller 270. Input/output registers 260 are bidirectionally coupled to major bus 205 to enable reading and writing within these registers. Input/output registers 260 are preferably within the ordinary memory space of central processing unit 200. Input/output registers 260 include data which specifies the control parameters of video display controller 270. In accordance with the data stored within the input/output registers 260, video display controller 270 generates the signals on video control bus 124 for the desired control of digital to video converter 160. Data within input/output registers 260 includes data for specifying the number of pixels per horizontal line, the horizontal synchronization and blanking intervals, the number of horizontal lines per frame and the vertical synchronization blanking intervals. Input/output registers 160 may also include data which specifies the type of frame interlace and specifies other types of video control functions. Lastly, input/output registers 260 is a depository for other specific kinds of input and output parameters which will be more fully detailed below.

Graphics processor 120 operates in two differing address modes to address memory 130. These two address modes are X Y addressing and linear addressing. Because the graphics processor 120 operates on both bit mapped graphic data and upon conventional data and instructions, different portions of the memory 130 may be accessed most conveniently via differing addressing modes. Regardless of the particular addressing mode selected, memory interface 250 generates the proper physical address for the appropriate data to be accessed. In linear addressing, the start address of a field is formed of a single multibit linear address. The field size is determined by data within a status register within central processing unit 200. In X Y addressing the start address is a pair of X and Y coordinate values. The field size is equal to the size of a pixel, that is the number of bits required to specify the particular data at a particular pixel.

Figure 3:
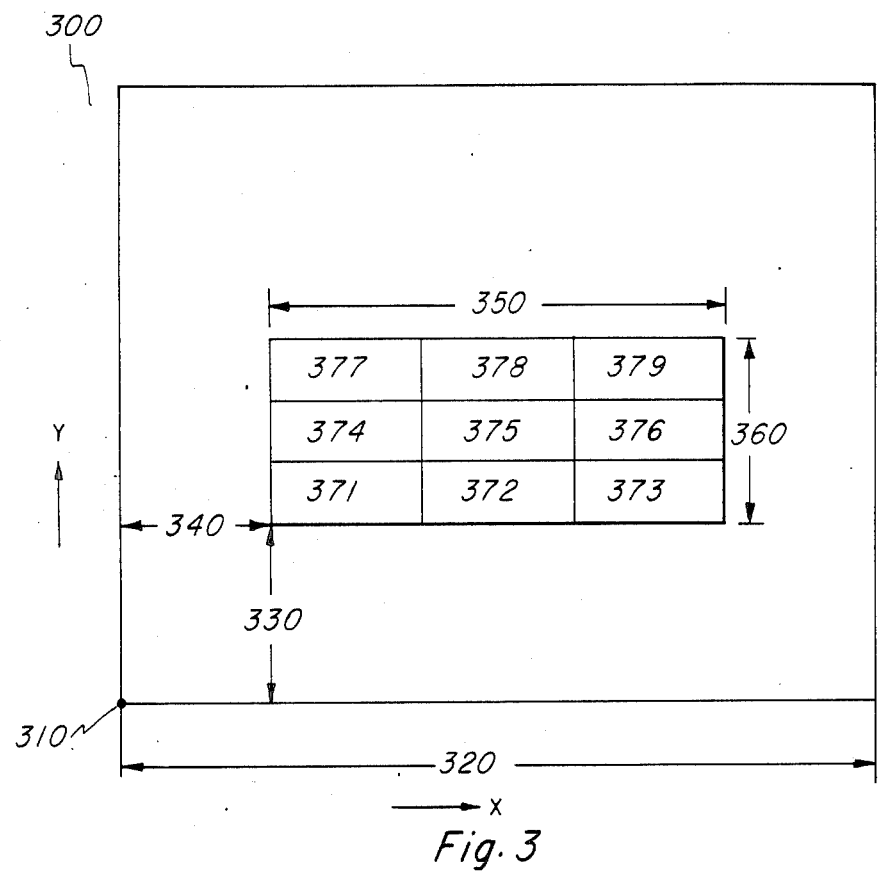
FIG. 3 illustrates the manner of specifying individual pixel addresses within the bit mapped memory in accordance with the X Y addressing technique.
Figure 4:
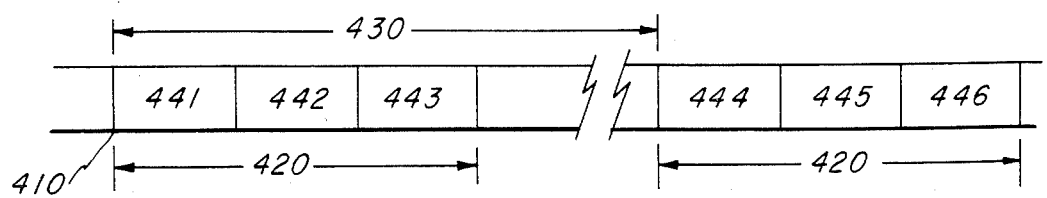
FIG. 4 illustrates a manner of specifying field addresses in accordance with the linear addressing technique.

FIG. 3 illustrates the arrangement of pixel data in accordance with an X Y addressing mode. Similarly, FIG. 4 illustrates the arrangement of similar data in accordance with the linear addressing mode. FIG. 3 shows origin 310 which serves as the reference point of the X Y matrix of pixels. The origin 310 is specified as a X Y start address and need not be the first address location within memory. The location of data corresponding to an array of pixels, such as a particular defined image element is specified in relation to the origin address 310. This includes an X start address 340 and a Y start address 330. Together with the origin, X start address 340 and Y start address 330 indicates the starting address of the first pixel data 371 of the particular image desired. The width of the image in pixels is indicated by a quantity delta X 350. The height of the image in pixels is indicated by a quantity delta Y 360. In the example illustrated in FIG. 3, the image includes nine pixels labeled 371 through 379. The last parameter necessary to specify the physical address for each of these pixels is the screen pitch 340 which indicates the width of the memory in number of bits. Specification of these parameters namely X starting address 340, Y starting address 330, delta X 350, delta Y 360 and screen pitch 320 enable memory interface 250 to provide the specified physical address based upon the specified X Y addressing technique.

FIG. 4 similarly illustrates the organization of memory in the linear format. A set of fields 441 to 446, which may be the same as pixels 371 through 376 illustrated in FIG. 3, is illustrated in FIG. 4. The following parameters are necessary to specify the particular elements in accordance with the linear addressing technique. Firstly, is the start address 410 which is the linear start address of the beginning of the first field 441 of the desired array. A second quantity delta X 420 indicates the length of a particular segment of fields in number of bits. A third quantity delta Y (not illustrated in FIG. 4) indicates the number of such segments within the particular array. Lastly, linear pitch 430 indicates the difference in linear start address between adjacent array segments. As in the case of X Y addressing, specification of these linear addressing parameters enables memory interface 250 to generate the proper physical address specified.

The two addressing modes are useful for differing purposes. The X Y addressing mode is most useful for that portion of video RAM 132 which includes the bit map data, called the screen memory which is the portion of memory which controls the display. The linear addressing mode is most useful for off screen memory such as for instructions and for image data which is not currently displayed This latter category includes the various standard symbols such as alphanumeric type fonts and icons which are employed by the computer system. It is sometimes desirable to be able to convert an X Y address to a linear address. This conversion takes place in accordance with the following formula:

$$LA = Off + (Y \times SP + X) \times PS$$

Where: LA is the linear address; Off is the screen offset, the linear address of the origin of the X Y coordinate system; Y is the Y address; SP is the screen pitch in bits; X is the X address; and PS is the pixel size in bits. Regardless of which addressing mode is employed, memory 250 generated the proper physical address for access to memory 130.

Figure 5:
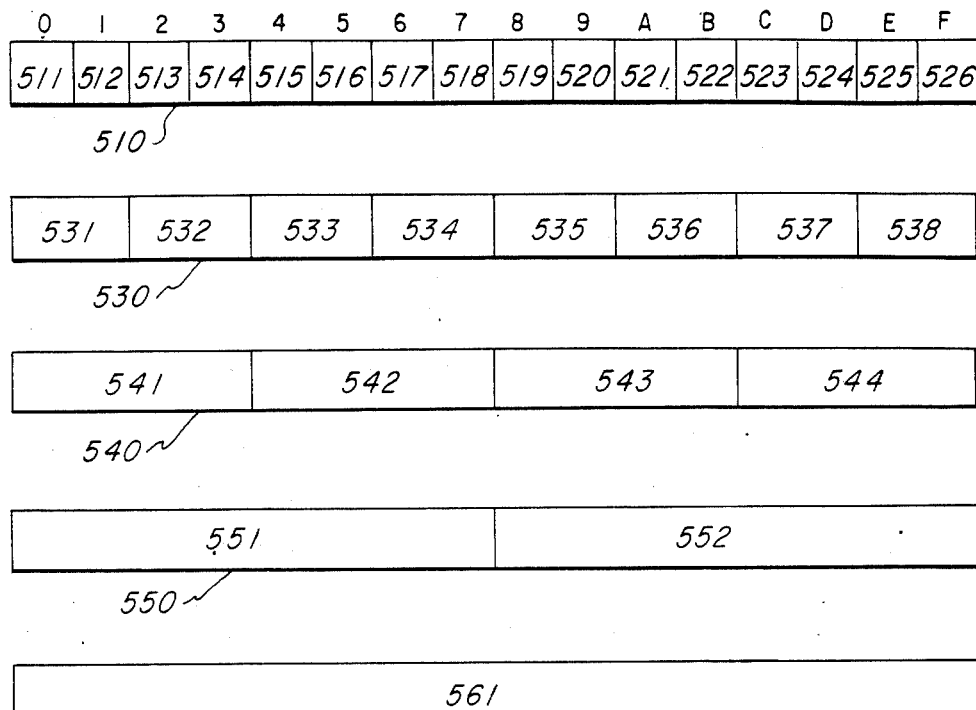
FIG. 5 illustrates the preferred embodiment of storage of pixel data of varying lengths within a single data word in accordance with the preferred embodiment of the present invention.

FIG. 5 illustrates the manner of pixel storage within data words of memory 130. In accordance with the preferred embodiment of the present invention, memory 130 consists of data words of 16 bits each. These 16 bits are illustrated schematically in FIG. 5 by the hexadecimal digits 0 through F. In accordance with the preferred embodiment of the present invention, the number of bits per pixel within memory 130 is an integral power of 2 but no more than 16 bits. As thus limited, each 16 bit word within memory 130 can contain an integral number of such pixels. FIG. 5 illustrates the five available pixel formats corresponding to pixel lengths of 1, 2, 4, 8 and 16 bits. Data word 510 illustrates 16 one bit pixels 511 to 516 thus 16 one bit pixels may be disposed within each 16 bit word. Data word 530 illustrates 8 two bit pixels 531 to 538 which are disposed within the 16 bit data word. Data word 540 illustrates 4 four bit pixels 541 to 544 within the 16 bit data word. Data word 550 illustrates 2 eight bit pixels 551 and 552 within the 16 bit word. Lastly, data word 560 illustrates a single 16 bit pixel 561 stored within the 16 bit data word. By providing pixels in this format, specifically each pixel having an integral power of two the number of bits is aligned with the physical word boundaries and, pixel manipulation via graphics processor 120 is enhanced. This is because processing each physical word manipulates an integral number of pixels. It is contemplated that within the portion of video RAM 132 which specifies the video display that a horizontal line of pixels is designated by a string of consecutive words such as illustrated in FIG. 5.

Figure 6:
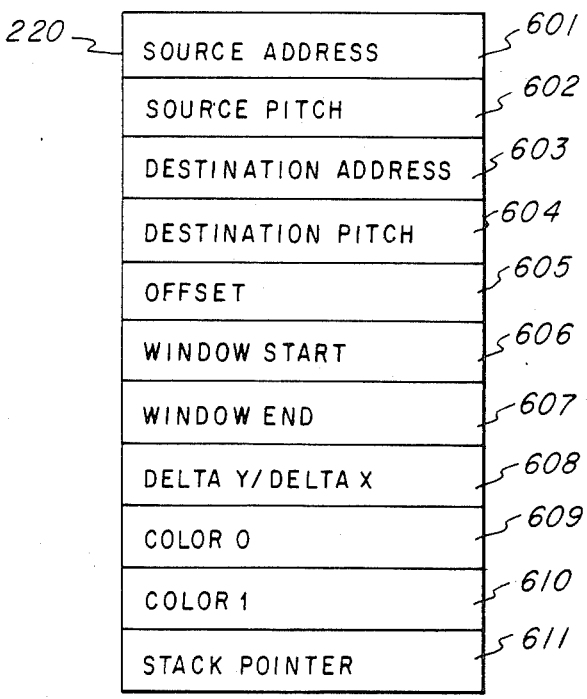
FIG. 6 illustrates the arrangement of contents of implied operands stored within the register memory in accordance with the preferred embodiment of the present invention.

FIG. 6 illustrates the contents of some portions of register files 220 which store implied operands for various graphics instructions. Each of the registers 601 through 611 illustrated in FIG. 6 are within the register address space of central processing unit 200 of graphics processor 120. Note, these register files illustrated in FIG. 6 are not intended to include all the possible registers within register files 220. On the contrary, a typical system will include numerous general purpose undesignated registers which can be employed by central processing unit 200 for a variety of program specified functions.

Register 601 stores the source address. This is the address of the lower left corner of the source array. This source address is the combination of X address 340 and Y address 330 in the X Y addressing mode or the linear start address 410 in the linear addressing mode.

Register 602 stores the source pitch or the difference in linear start addresses between adjacent rows of the source array. This is either screen pitch 340 illustrated in FIG. 3 or linear pitch 430 illustrated in FIG. 4 depending upon whether the X Y addressing format or the linear addressing format is employed.

Registers 603 and 604 are similar to registers 601 and 602, respectively, except that these registers include the destinations start address and the destination pitch. The destination address stored in register 603 is the address of the lower left hand corner of the destination array in either X Y addressing mode or linear addressing mode. Similarly, the destination pitch stored in register 604 is the difference in linear starting address of adjacent rows, that is either screen pitch 320 or liner pitch 430 dependent upon the addressing mode selected.

Registers 605 stores the offset. The offset is the linear bit address corresponding to the origin of the coordinates of the X Y address scheme. As mentioned above, the origin 310 of the X Y address system does not necessarily belong to the physical starting address of the memory. The offset stored in register 605 is the linear start address of the origin 310 of this X Y coordinate system. This offset is employed to convert between linear and X Y addressing.

Registers 606 and 607 store addresses corresponding to a window within the screen memory. The window start stored in register 606 is the X Y address of the lower left hand corner of a display window. Similarly, register 607 stores the window end which is the X Y address of the upper right hand corner of this display window. The addresses within these two registers are employed to determine the boundaries of the specified display window. In accordance with the well known graphics techniques, images within a window within the graphics display may differ from the images of the background. The window start and window end addresses contained in these registers are employed to designate the extent of the window in order to permit graphics processor 120 to determine whether a particular X Y address is inside or outside of the window.

Register 608 stores the delta Y/delta X data. This register is divided into two independent halves, the upper half (higher order bits) designating the height of the source array (delta Y) and the lower half (lower order bits) designating the width of the source array (delta X). The delta Y/delta X data stored in register 608 may be provided in either the X Y addressing format or in the linear addressing format depending upon the manner in which the source array is designated. The meaning of the two quantities delta X and delta Y are discussed above in conjunction with FIGS. 3 and 4.

Registers 609 and 610 each contain pixel data. Color 0 data stored in register 609 contains a pixel value replicated throughout the register corresponding to a first color designated color 0. Similarly, color 1 data stored in register 610 includes a pixel value replicated throughout the register corresponding to a second color value designated color 1. Certain of the graphics instructions of graphics processor 120 employ either or both of these color values within their data manipulation. The use of these registers will be explained further below.

Lastly, the register file 220 includes register 611 which stores the stack pointer address. The stack pointer address stored in register 611 specifies the bit address within video RAM 132 which is the top of the data stack. This value is adjusted as data is pushed onto the data stack or popped from the data stack. This stack pointer address thus serves to indicate the address of the last entered data in the data stack.

Figure 7:
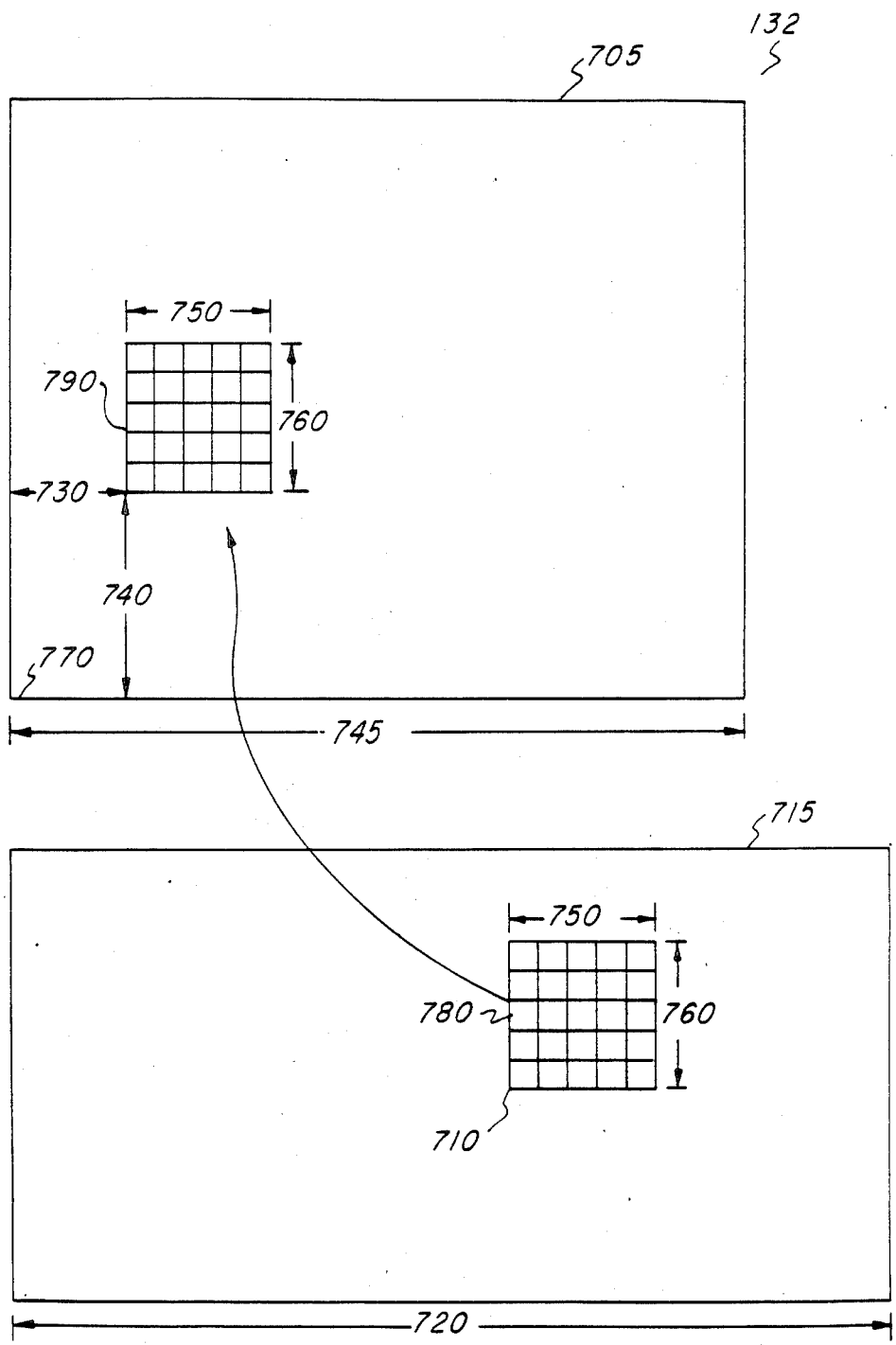
FIG. 7 illustrates the characteristics of an array move operation within the bit mapped memory of the present invention.

FIG. 7 illustrates in schematic form the process of an array move from off screen memory to screen memory. FIG. 7 illustrates video RAM 132 which includes screen memory 705 and off screen memory 715. In FIG. 7 an array of pixels 780 (or more precisely the data corresponding to an array of pixels) is transferred from off screen memory 715 to screen memory 705 becoming an array of pixels 790.

Prior to the performing the array move operation certain data must be stored in the designated registers of register files 220. Register 601 must be loaded with the beginning address 710 of the source array of pixels. In the example illustrated in FIG. 7 this is designated in linear addressing mode. The source pitch 720 is stored in register 602. Register 603 is loaded with the destination address. In the example illustrated in FIG. 7 this is designated in X Y addressing mode including X address 730 and Y address 740. Register 604 has the destination pitch 745 stored therein. The linear address of the origin of the X Y coordinate system, offset address 770, is stored in register 605. Lastly, delta Y 750 and delta X 760 are stored in separate halves of register 608.

The array move operation illustrated schematically in FIG. 7 is executed in conjunction with the data stored in these registers of register file 220. In accordance with the preferred embodiment the number of bits per pixel is selected so that an integral number of pixels are stored in a single physical data word. By this choice, the graphics processor may transfer the array of pixels 780 to the array of pixels 790 largely by transfer of whole data words. Even with this selection of the number of bits per pixel in relation to the number of bits per physical data word, it is still necessary to deal with partial words at the array boundaries in some cases. However, this design choice serves to minimize the need to access and transfer partial data words.

In accordance with the preferred embodiment of the present invention, the data transfer schematically represented by FIG. 7 is a special case of a number of differing data transformations. The pixel data from the corresponding address locations of the source image and the destination image are combined in a manner designated by the instruction. The combination of data may be a logical function (such as AND or OR) or it may be an arithmetic function (such as addition or subtraction). The new data thus stored in the array of pixels 790 is a function of both the data of the array of pixels 780 and the current data of pixels 790. The data transfer illustrated in FIG. 7 is only a special case of this more general data transformation in which the data finally stored in the destination array does not depend upon the data previously stored there.

Figure 8:
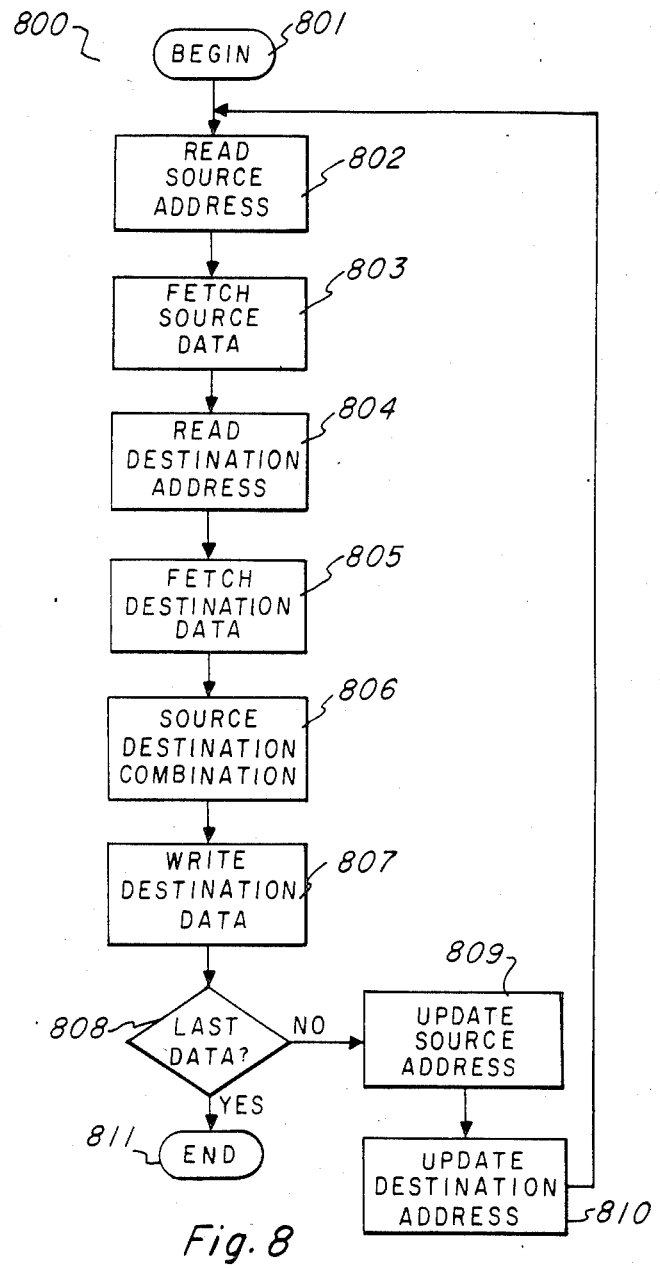
FIG. 8 illustrates a flow chart of a bit block transfer or array move operation in accordance with the present invention.

This process is illustrated by the flow chart in FIG. 8. In accordance with the preferred embodiment the transfer takes place sequentially by physical data words. Once the process begins (start block 801) the data stored in the register 601 is read to obtain the source address (processing block 802). Next graphics processor 120 fetches the indicated physical data word from memory 130 corresponding to the indicated source address processing block 803). In the case that the source address is specified in the X Y format, this recall of data would include the steps of converting the X Y address into the corresponding physical address. A similar process of recall of the destination address from register 603 (processing block 804) and then fetching of the indicated physical data word (processing block 805) takes place for the data contained at the destination location.

This combined data is then restored in the destination location previously determined (processing block 806). The source and destination pixel data are then combined in accordance with the combination mode designated by the particular data transfer instruction being executed. This is performed on a pixel by pixel basis even if the physical data word includes data corresponding to more than one pixel. This combined data is then written into the specified destination location (processing block 807).

In conjunction with the delta Y/delta X information stored in register 608, graphics processor 120 determines whether or not the entire data transfer has taken place (decision block 808) by detecting whether the last data has been transferred. If the entire data transfer has not been performed, then the source address is updated. In conjunction with the source address previously stored in register 601 and the source pitch data stored in register 602 the source address stored in register 601 is updated to refer to the next data word to be transferred (processing block 809). Similarly, the address stored in register 603 is updated in conjunction with the destination pitch data stored in register 604 to refer to the next data word in the destination (processing block 810). This process is repeated using the new source stored in register 601 and the new destination data stored in register 603.

As noted above the delta Y/delta X data stored in register 608 is used to define the limits of the image to be transferred. When the entire image has been transferred as indicated with reference to the delta Y/delta X data stored in register 608 (decision block 808), then the instruction execution is complete (end block 811) and graphics processor 120 continues by executing the next instruction in its program. As noted, in the preferred embodiment this process illustrated in FIG. 8 is implemented in instruction microcode and the entire data transformation process, referred to as an array move, is performed in response to a single instruction to graphics processor 120.

Figure 9:
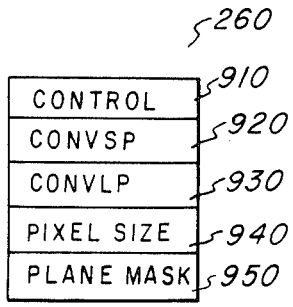
FIG. 9 illustrates some of the data which is stored in various registers of the set of input/output registers.

FIG. 9 illustrates a portion of input/output registers 260 which is employed to store data relevant to the transparency operations of the present invention. Firstly, input/output registers 260 includes a register 910 which stores a control word. This control word is used to specify types of operations performed by central processing unit 210. In particular, several bits within the control words stored within register 910 specify the type of source destination combination performed during array moves. As noted in regards to FIG. 8 and in particular to processing block 806, this combination of source and pixel data may include various logic and arithmetic functions. In addition, a single bit within register 910 is used to indicate whether or not the transparency operation is enabled. Thus by proper setting or resetting of this particular bit within register 910, the transparency operation may be enabled or disabled.

Registers 920 and 930 are employed to store data which is useful in converting between X Y and linear addresses. CONVSP data stored in register 920 is a precalculated factor employed to enable conversion from X Y addressing to linear addressing for screen pitch. This factor is:

16+log$_2$ (screen pitch)

In a similar fashion, the data CONVLP stored in register 930 is employed for conversion between X Y addressing and linear addressing for the linear pitch. This data corresponds to:

16+log$_2$ (linear pitch)

Storing this data in registers 920 and 930 in this manner enables central processing unit 200 to readily access this data in order to quickly implement the conversions between X Y addressing and linear addressing.

Register 940 has the pixel size data stored therein. The pixel size data indicates the number of bits per pixel within the displayable portion of video RAM 132. As previously noted in conjunction with FIG. 5, the pixel size is constrained by the preferred word size. In the preferred embodiment, graphics processor of the present invention operates on 16 bit data word. The number of bits per pixel is constrained in the preferred embodiment to be an integral factor of 16, the number of bits per word. Thus, the number of bits per word could be one, two, four, eight or sixteen. Register 940 stores pixel size data which equals the number of bits per word selected. Thus, if a single bit per word has been selected, register 940 stores the numerical data 1. Similarly, if two-bit per pixel has been selected, then register 940 stores numerical data equal to 2. Likewise, other possible numbers of bits per pixel are indicated by the numeric values stored within register 940. This pixel size data is employed by central processing unit 200 and special graphics hardware 210 in executing various instructions, in particular the transparency operation to be discussed further below.

Register 950 stores a plane priority mask which is employed in raster operations. Register 950 stores a bit mask which defines which portions of each pixel color code are to be actively modified during an array move operation such as illustrated in FIG. 8. In the preferred embodiment the number of bits per pixel, i.e. the pixel size, is limited to an integral fraction of the physical data word employed by the graphics data processing apparatus. Therefore register 950 includes an integral number of sets of bits equal to the pixel size. In accordance with the preferred embodiment, register 910 includes the plane mask, which is equal in length to the pixel size, replicated throughout the register. In the plane mask "1" bits correspond to bits within the pixel color code which are to be written into the destination location and "0" bits correspond to bits which are to be unchanged in the destination location. This permits only parts of the pixel color code to be modified by a raster operation. This feature is useful when the pixel color codes represent a number of separable attributes, such as red, blue and green color intensities. Plane masking can be disabled by setting register 950 to all "1's" thereby assuring that all pixels of the destination are affected.

Figure 10:
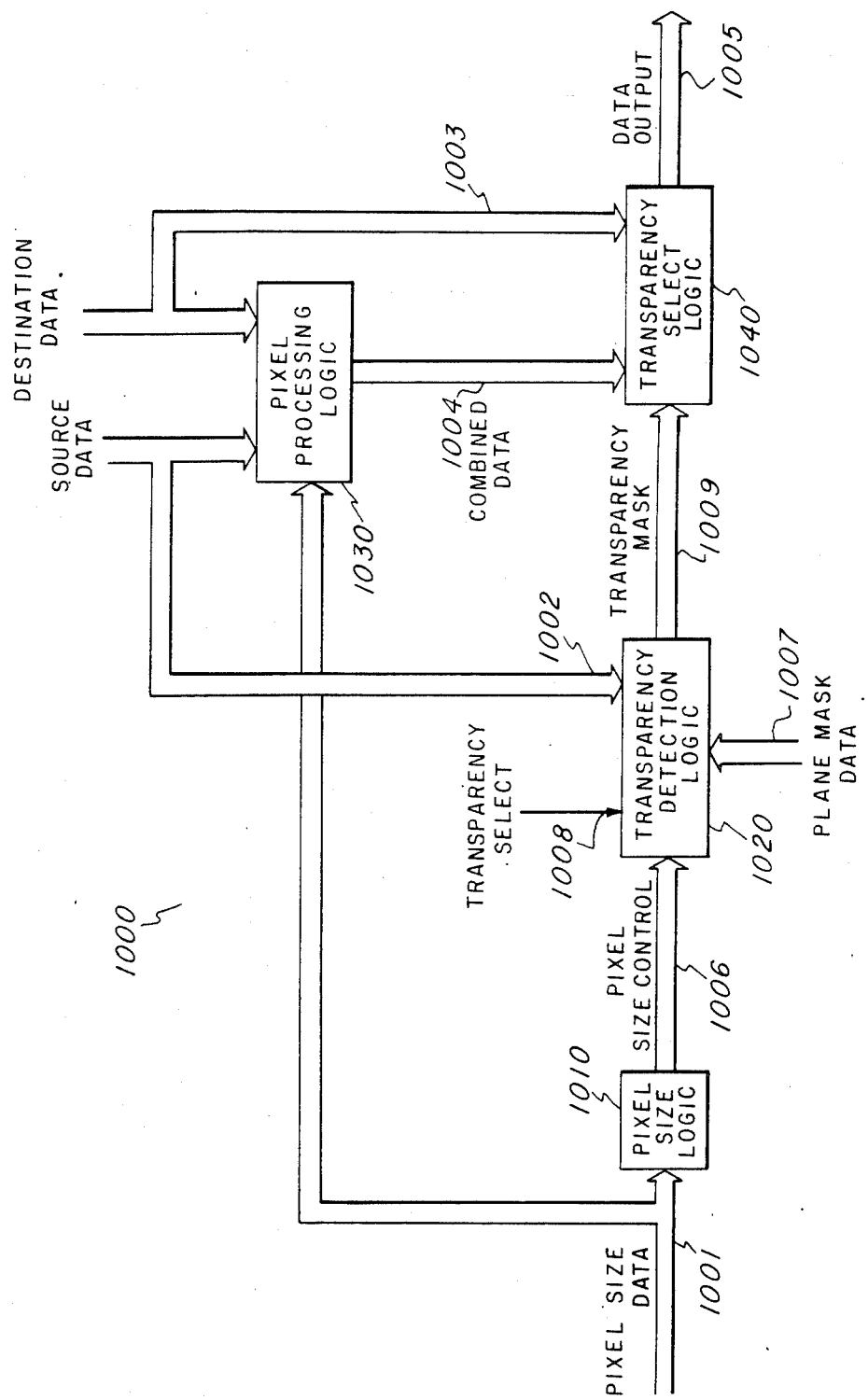
FIG. 10 illustrates in block diagram form the manner of providing a transparency function for a variable number of bits per pixel.

FIG. 10 illustrates the general construction of the transparency apparatus in accordance with the present invention. FIG. 10 illustrates transparency logic 1000 which is a part of special graphics hardware 210. Transparency logic 1000 includes pixel size logic 1010, transparency detection logic 1020, pixel processing logic 1030 and transparency select logic 1040. In general, transparency detection logic 1020 detects transparent pixels from the source data on source data bus 1002 and enables transparency select logic 1040 to select, on a bit by bit basis, between the combined data from pixel processing logic 1030 on combined data bus 1004 and the destination data on destination bus 1003. Transparency select logic generates a data output on data output bus 1005 which is written into the destination location in accordance with processing block 807 as per in FIG. 8.

Pixel size logic 1010 receives pixel size data on pixel size bus 1001 and generates pixel size control data on pixel size control bus 1006. The pixel size data corresponds to the data stored in register 940 illustrated in FIG. 9. This data is passed to special graphics hardware 210 from register files 220 by a central processing unit 200 and is available for use in the special graphics hardware 210. As noted above in conjunction with FIG. 9, the pixel size data stored in register 940 corresponds to the number of bits per pixel of the color codes representing the pixels of the graphics image. In accordance with the preferred embodiment of the present invention, the pixel size may be either 1, 2, 4, 8 or 16 bits. As illustrated in FIG. 5, this permits an integral number of pixels to be contained within a single 16 bit data word. As a consequence, the pixel size can be represented by a 5 bit number in which only a single of the 5 bits is a "1".

Figure 11:
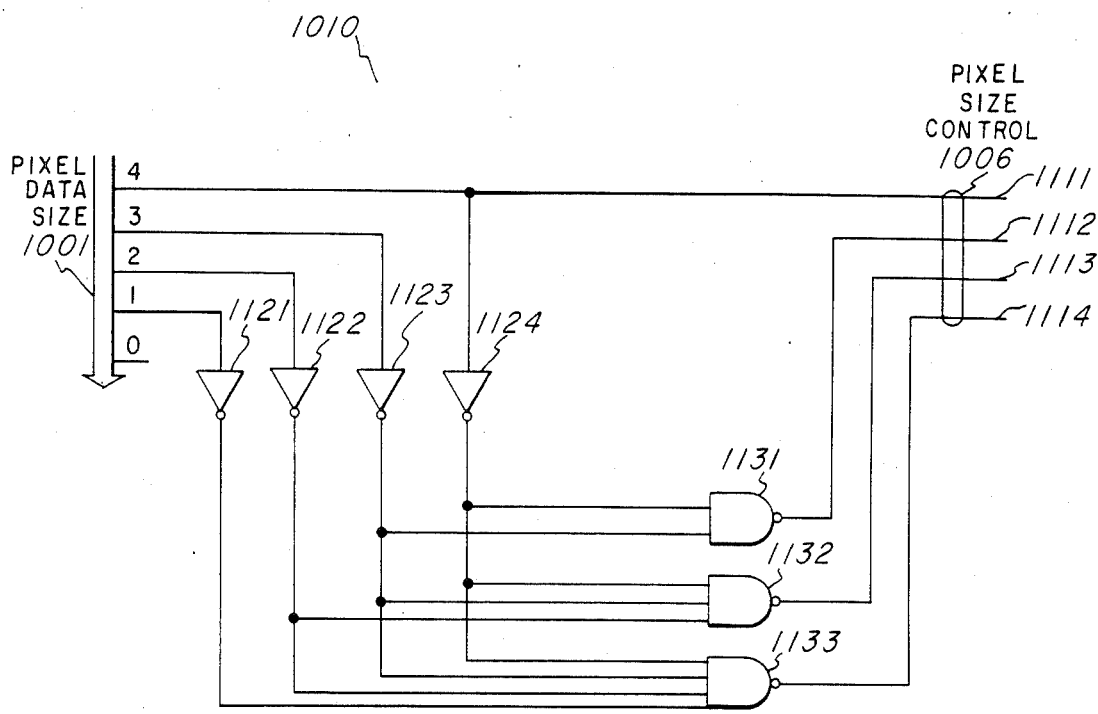
FIG. 11 illustrates the details of the pixel size logic illustrated in FIG. 10.

FIG. 11 illustrates in detail the contruction of pixel size logic 1010. Individual bits of pixel size data are applied via a multibit input bus, pixel size data bus 1001 to pixel size logic 1010. These individual bits are indicated by the bit numbers 0 to 4 going from least significant to the most significant bit. FIG. 11 also illustrates pixel size control bus 1006 which includes individual lines 1111, 1112, 1113 and 1114. These individual lines of pixel size control bus 1006 are applied to transparency detection logic 1020 and operate in a manner which will be more further described below.

The most significant bit of the pixel size data bus 1001, designated bit number 4 is applied directly to line 1111. Additionally, this most significant bit is also applied to inverter 1124. The next most significant bit, bit number 3, is applied to inverter 1123. Likewise, bit number 2 is applied 1122 and bit number 1 is applied to inverter 1121. Note that the least significant bit, here designated as bit 0, is not employed within pixel size logic 1010.

Pixel size logic 1010 includes three NAND gates 1131, 1132, 1133. The NAND gates 1131 drives the line 1112. Applied to the inputs of this NAND gates are the outputs from inverters 1123 and 1124. Thus the output of NAND gates 1131 is "0+ only when the most significant bit 4 and the next most significant bit 3 of the pixel size data are both "0".

The NAND gate 1132 has inputs applied to it from inverters 1122, 1123, and 1124. The output of this gate is "0" only when the 3 most significant bits, the bit numbers 2, 3 and 4, of the pixel size data are all "0". This output is applied to line 1113.

Lastly, NAND gate 1133 receives an input from each of the inverters 1121 to 1124. Thus NAND gate 1133 generates an output of "0" only when each of the 4 most significant bits, bit numbers 1 to 4, of the pixel size data are "0". This output is applied to line 1114.

Table 1, shown below, illustrates the relationship between this bits from the pixel size data bus 1001, the pixel size and the output on lines 1111, 1112, 1113 and 1114. Note that because the pixel size is limited to 1, 2, 4, 8, or 16 bits, the illustrated combination of the 5 pixel size bits are the only legal combinations of these bits. The use of the output of pixel size control bus 1006 will be further detailed below in conjunction with the description of the transparency detection logic 1020.

TABLE 1

| Pixel Size Data Bits | | | | | | Pixel Control Data Bits | | | |
|---|---|---|---|---|---|---|---|---|---|
| 4 | 3 | 2 | 1 | 0 | Pixel Size | 1111 | 1112 | 1113 | 1114 |
| 0 | 0 | 0 | 0 | 1 | 1 | 0 | 0 | 0 | 0 |
| 0 | 0 | 0 | 1 | 0 | 2 | 0 | 0 | 0 | 1 |
| 0 | 0 | 1 | 0 | 0 | 4 | 0 | 0 | 1 | 1 |
| 0 | 1 | 0 | 0 | 0 | 8 | 0 | 1 | 1 | 1 |
| 1 | 0 | 0 | 0 | 0 | 16 | 1 | 1 | 1 | 1 |

TABLE 1-continued

Transparency detection logic 1020 receives inputs from source data bus 1002, pixel size control bus 1006, plane mask data bus 1007 and transparency select line 1008. Transparency detection logic 1020 generates an output on transparency mask bus 1009 which indicates bit by bit whether the combined data or the destination data is to selected by transparency select logic 1040. Transparency detection logic 1020 detects transparent pixels from the source data 1002, that is pixels in which all of the bits are "0". This detection is made in conjunction with the plane mask data on plane mask data bus 1007 such that bits which are not enabled by the plane mask are not employed in the detection of transparency.

Figure 12B:
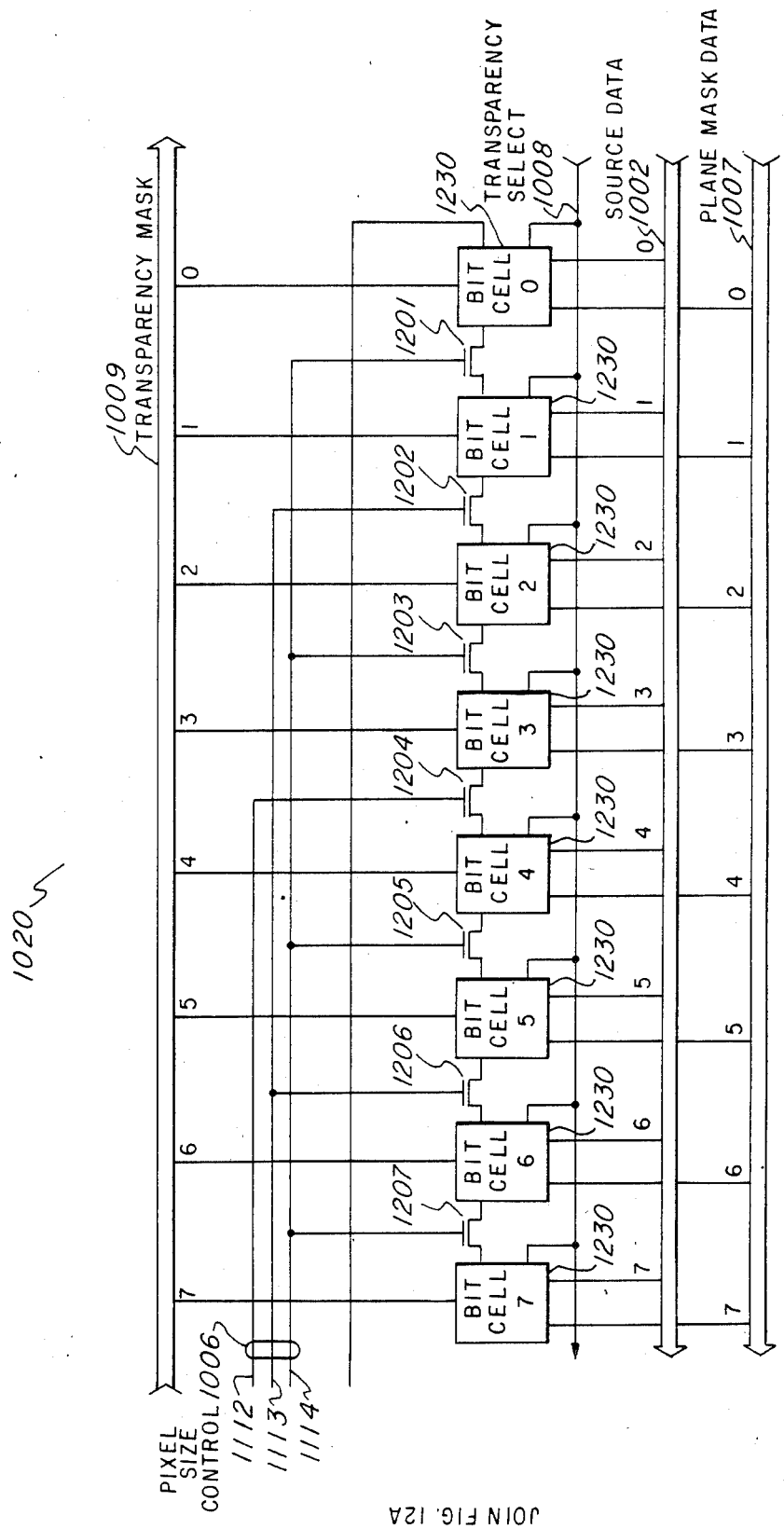

The details of transparency detection logic 1020 are illustrated in FIGS. 12A and 12B. Transparency detection ligic 1020 consists in the main of 16 bit cells 1230 disposed in a series relationship. Each bit cell 1230 receives data from a corresponding bit of source data bus 1002 and data from a corresponding bit of plane mask data bus 1007. Each bit cell 1230 also receives an input from transparency select line 1008. Each bit cell 1230 generates an output on a corresponding bit of transparency mask bus 1009. As can be seen from a study of FIGS. 12A and 12B, bit cells 1230 are connected in series by a plurality of field effect transistors 1201 and 1216. These field effect transistors 1201 to 1216 have their gates connected to respective lines of the pixel size control bus 1006.

The 16 bit cells 1230 are coupled together in groups corresponding to the pixel size by virtue of the gate signals applied to field effect transistors 1201 to 1216 from the lines 1111, 1112, 1113, and 1114 of pixel size control bus 1006. In the event that a pixel size of 1 bit has been selected, then the output on each of lines 1111, 1112, 1113, and 1114, is "0". See Table 1. As a consequence, none of the field effect transistors 1201 to 1216 are conductive. Therefore, each of the 16 bit cells 1230 is isolated from each of the other bit cells. Thus the 16 bit cells 1230 are separated into groups of 1 bit cell each, in accordance with the pixel size data indicating data of 1 bit in length.

On the other hand, if the pixel size indicated by the pixel size data bus 1001 is 2, then a "1" output is generated on line 1114. This enables field effect transistors 1201, 1203, 1205, 1207, 1209, 1211, 1213, and 1215. This serves to couple together bit cells 1230 into groups of 2 each. Thus field effect device 1201 couples together bit cells 0 and 1, field effect device 1203 couples together bit cells 2 and 3, field effect device 1205 couple together bit cells 4 and 5. Similary, other bit cells are connected together in groups of 2. Because of this interconnection of the bit cells the outputs of each of these groups of 2 bit cells are the same. The manner in which this is achieved will be more fully described below in conjunction with a detailed description of the construction of each of the bit cells 1230.

Likewise, if the pixel size data indicates that the pixel size is 4, both lines 1114 and 1113 have "1" outputs. In this manner, field effect transistors 1201, 1202, 1203, 1205, 1206, 1207, 1209, 1210, 1211, 1213, 1214, and 1215 are turned on there by coupling together their respective bit cells 1230. This serves to couple together the 16 bit cells 1230 into groups of 4, bit cells 0, 1, 2, and 3, bit cells 4, 5, 6, and 7, bit cells 8, 9, 10, 11, and bit cells 12, 13, 14, and 15. Therefore, as described below in conjunction with case of pixel size of 2, the output of each bit cell in these groups of 4 bit cells is identical.

Similarly, if the pixel size data indicates a pixel size of 8 bits, lines 1112, 1113, and 1114 of pixel size control bus 1006 all have outputs of "1". In this manner each of the field effect transistors 1201 to 1216 is enabled for conduction except for field effect transistors 1208 and 1216. Thus, the bits cells 1230 are connected together in 2 groups of 8 bit cells each. These 2 groups are bit cells 0 to 7 and bit cells 8 to 15. Because of this coupling, the output of each bit cell in each of these groups of 8 are identical.

Lastly, in the event that the pixel size data indicates a pixel size of 16 all of the lines of pixel size control bus 1006 have "1" outputs. This enables each of the 16 field effect transistors 1201 to 1216. Thus all 16 bit cells 1230 are coupled together as a single unit. Note that field effect transistor 1216 couples bit cell 15 to bit cell 0. As a consequence of this coupling by the field effect transistors, all of the bit cells 1230 generate the same output on their respective lines attached to transparency mask bus 1009.

Figure 13:
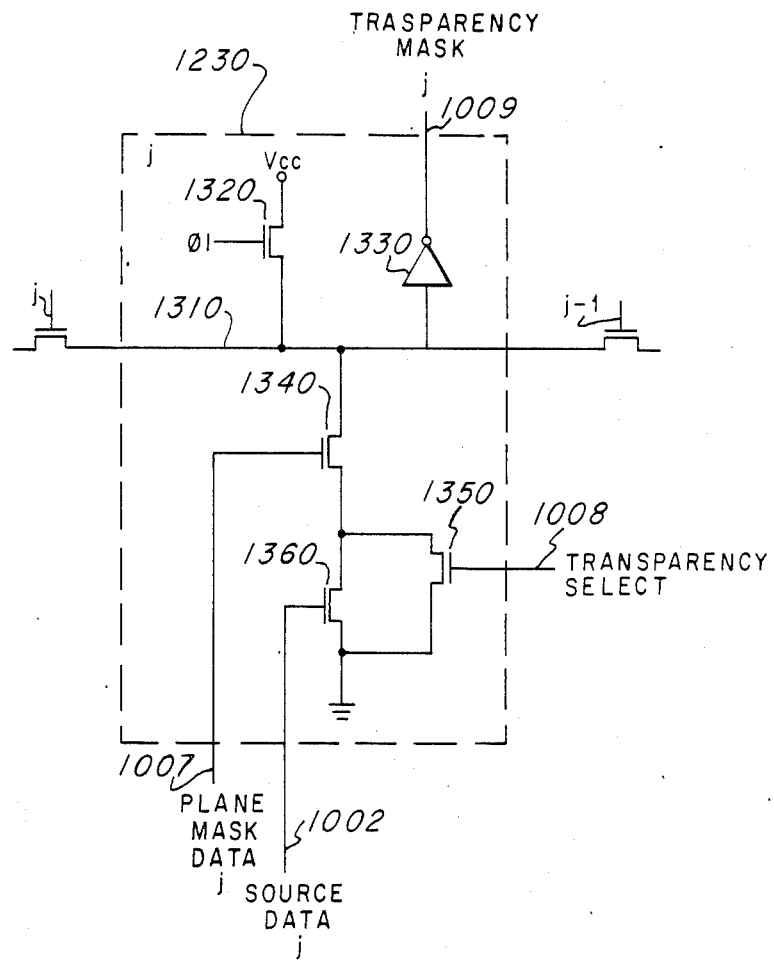
FIG. 13 illustrates the details of one example of the bit cell illustrated in FIGS. 12A and 12B.
Figure 14:
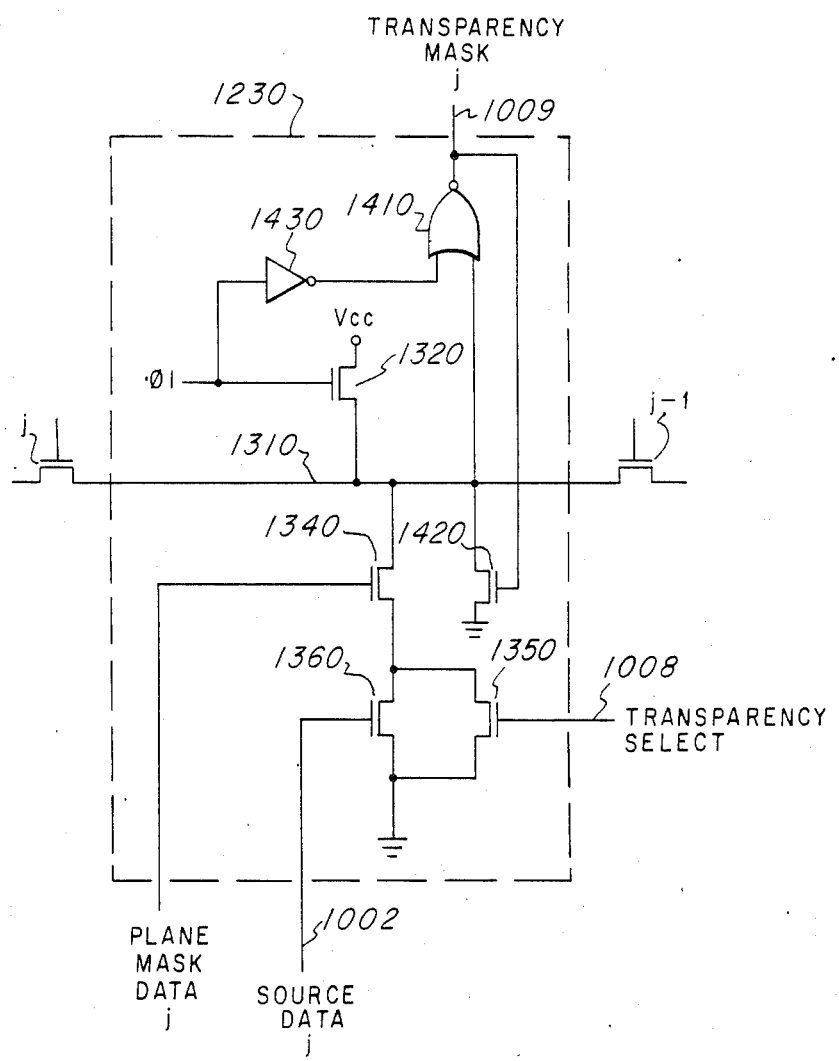
FIG. 14 illustrates the details of an improved embodiment of the bit cell illustrated in FIGS. 12A and 12B.

The details of construction of two alternatives for bit cells 1230 will now be described in conjunction with the matter illustrated in FIGS. 13 and 14. FIG. 13 illustrates the construction of a simple embodiment of the bit cell. FIG. 14 illustrates the construction of a more complex cell which enables greater speed of detection of transparency.

FIG. 13 illustrates the details of one embodiment of bit compare cell 1230. Bit compare cell 1230 employs the precharge/conditional discharge logic technique. At a time set by the clock signal, $\phi 1$, field effect transistor 1320 is conductive to couple the voltage source $V_{cc}$ to the circuit node 1310. At some later time the signal $\phi 1$ causes field effect transistor 1320 to be disabled, thereby isolating circuit node 1310 from the voltage source $V_{cc}$. Depending upon the inputs supplied by source data bus 1002, plane mask data bus 1007 and transparency select line 1008, the charge stored on circuit node 1310 may be discharged to ground. The input of inverter 1330 is coupled to circuit node 1310 and generates an output which is the j-th bit of transparency mask bus 1009. Depending upon the state of the input to bit cell 1230, either the charge remains on circuit node 1310 or this circuit node is discharged to the ground. Inverter 1330 senses this state and generates the signal for application to transparency mask bus 1009.

Circuit node 1310 may be discharged depending upon the state of the source data, plane mask data and transparency select signals applied to this bit cell 1230. Field effect transistor 1340 has its source connected to circuit node 1310 and has its gate controlled by the j-th bit of the plane mask bus 1007. If the particular bit of plane mask data bus 1007 is a "1" then field effect transistor 1340 is enabled for conduction. In such a case bit cell 1230 becomes responsive to the source data and the transparency select line. If on the contrary, the plane mask data is a "0" then field effect transistor 1340 is disabled and no charge can be removed from circuit node 1310 via this path. This corresponds the case in which the particular bit of the pixel color code is not selected, that is data corresponding to this bit is not to be written into the destination location. Thus unless circuit node 1310 is discharged through other bit cells 1230 via one of the field effect transistors j or j−1, corresponding to field effect transistors 1201 to 1216, then the charge remains stored at circuit node 1310. It should be noted that the non-selection of this particular bit via the plane mask data is the same as if this particular bit had been transparent.

The source drain path of field effect transistor 1350 serves to couple field effect transistor 1340 to ground. Field effect transistor 1350 is controlled by transparency select line 1008. Transparency select line 1008 is responsive to the single bit within register 910 which indicates whether or not transparency operation is enabled. If transparency operation is not enabled, then transparency select line 1008 causes field effect transistor 1350 to be turned on. This causes circuit node 1310 to be discharged through field effect transistor 1340 and 1350 whenever the plain mask data has selected this particular bit. On the other hand, if transparency has been enabled then transparency select line 1008 disables field effect transistor 1350. Therefore, circuit node 1310 is discharged or not discharged depending upon the state of source data 1002.

The source drain path of field effect transistor 1360 serves to connect field effect transistor 1340 to ground. The gate of field effect transistor 1360 is responsive to the j-th bit of source data bus 1002. The input from the j-th bit of source data bus 1002 thus serves to determine whether or not the circuit node 1310 is discharged. If the j-th bit of source data bus 1002 is a "1" then field effect transistor 1360 is enabled to conduct. Therefore, the charge temporarily stored on circuit node 1310 is discharged. Inverter 1330 senses this discharge state and generates a "1" output to transparency mask 1009. Alternatively, if the source data is a "0" then field effect transistor 1360 is not enabled. Therefore the charge on circuit node 1310 is not discharged. Thus the output of inverter 1330 to the j-th bit of transparency mask 1009 is a "0".

The foregoing discussion of the operation of bit cell 1230 assumes that the particular bit cell 1230 is not coupled to other bit cells via field effect transistors 1201 to 1216. This would be the case only if a bit size of 1 bit is selected. In any other instance, each bit cell 1230 is coupled to one or more other bit cells 1230. Consider the case in which a pixel size of 4 has been selected. In such an event bit cells 0 to 3 would be coupled together via field effect transistors 1201, 1202 and 1203. In such an event, the node 1310 of each of these bit cells is coupled together via the respective field effect transistors. Thus, if any of these bit cells holds a source data input of "1" not only the node 1310 of that bit cell is discharged, but also the node 1310 of all of the other bit cells 1230 within this group are also discharged. Therefore, if any bit within the 4 bit color code is a "1" then the output of each bit cell of this group of bit cells is "1". Only if all of the inputs to these 4 bit cells is "0" is the output of each of these 4 bit cells "0". This corresponds to a NAND function. Thus transparency detection logic 120 detects any pixel codes of all "0".

FIG. 14 illustrates an additional embodiment of the bit cell 1230 illustrated in FIGS. 12A and 12B. This embodiment illustrated in FIG. 14 has improved response time. The bit cell 1230 illustrated in FIG. 14 corresponds substantially to the bit cell illustrated in FIG. 13, except for a new sensing circuit comprising NOR gate 1410 and inverter 1430 and the addition of a further discharge path through field effect device 1420.

As explained above in conjunction with FIG. 13, the momentary signal at φ1 causes field effect transistor 1320 to momentarily couple node 1310 to the supply voltage $V_{cc}$. The discharge mechanism relating to source data bus 1002, plane mask data bus 1007 and transparency select line 1008 are identical to that illustrated in FIG. 13.

Inverter 1330 illustrated in FIG. 13 is replaced by NOR gate 1410 and inverter 1430 in FIG. 14. One input of NOR gate 1410 comes from the output of inverter 1430, while the other input comes from circuit node 1310. During the time that the clocking signal φ1 causes field effect device 1320 to charge circuit node 1310, NOR gate 1410 is made unresponsive to the signal at circuit node 1310 via the input from inverter 1430. When the clocking signal φ1 turns field effect transistor 1320 off, the output of inverter 1430 changes states so that NOR gate 1410 becomes an inverter with its input tied to circuit node 1310. Any time that the voltage at circuit node 1310 falls below the threshold voltage of NOR gate 1410, such as when the charge stored on circuit node 1310 is partially discharged, the output of NOR gate 1410 becomes a "1". This causes a "1" output to be placed upon the j-th bit of transparency mask bus 1009. In addition, this output is applied to the gate of field effect transistor 1420. The source/drain path of field effect transistor 1420 is coupled between circuit node 1310 and ground. Thus, if the voltage at circuit node 1310 falls below the threshold voltage of NOR gate 1410, field effect transistor 1420 is turned on providing a further discharge path for any charge stored on circuit node 1310.

The construction illustrated in FIG. 14 is advantageous over that of FIG. 13 due to an increased response time. In the worst case, that is when the pixel size is 16 and when only a single bit from source data bus 1002 is a "1", then the circuit nodes 1310 of each of bit cell 1230 must be discharged through a single discharge path if the construction illustrated in FIG. 13 is employed. However, if the construction illustrated in FIG. 14 is adopted, each time the charge on a circuit node 1310 of another bit cell 1230 falls below the threshold voltage of NOR gate 1410, a further discharge path is established via field effect device 1420. In addition, each additional discharge path formed in this manner begins to discharge the circuit node 1310 of the other adjacent bit cell 1230. Therefore, a series ripple of discharge paths will form throughout the connected group of bit compare cells 1230 forming a ripple carry effect to quickly discharge all of the circuit nodes 1310. Although this mechanism is most useful for the case in which 8 or 16 bits are selected for the pixel size, it enables reduced time to achieve a stable state in any case having two or more bits per pixel.

Referring back to FIG. 10 it is seen that pixel processing logic 1030 is responsive to source data bus 1002, destination data bus 1003 and pixel size data bus 1001. Pixel processing logic 1030 generates an output on combined data bus 1004 for application to transparency select logic 1040. The details to the operation of pixel processing logic 1030 are not germane to present invention. It is only necessary that pixel processing logic 1030 forms some sort of arithmetic or logical combination between the individual pixel data from source data bus 1002 and destination bus 1003. This combined data is then applied to transparency select logic 1040.

Figure 15:
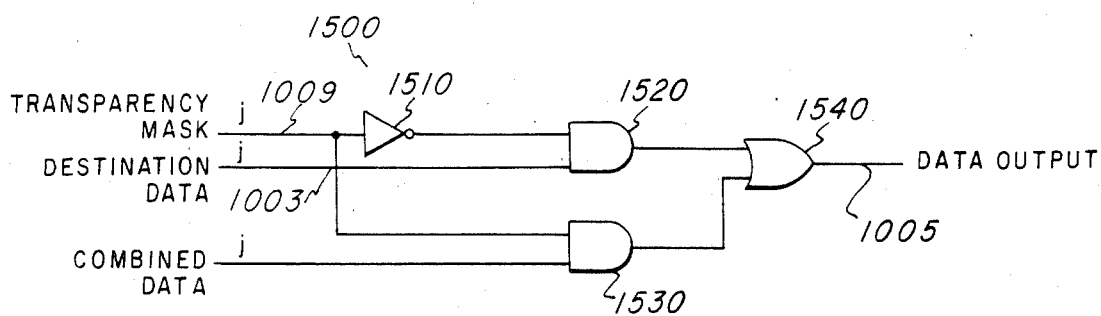
FIG. 15 illustrates the details of a representative bit of the transparency select logic illustrated in FIG. 10.

Transparency select logic 1040 enables selection of data from either combined data bus 1004 or destination data bus 1003 based upon the state of the corresponding bit of transparency mask bus 1009. An example of the j-th bit of transparency select logic 1040 is illustrated in FIG. 15. The j-th bit of the transparency mask bus 1009 is applied to inverter 1510 and one input of AND gate 1530. The output of inverter 1510 is applied to one input of another AND gate 1520. This arrangement insures that the signal on the j-th bit of the transparency mask bus 1009 enables one of the AND gates 1520 or 1530. The j-th bit of the destination data bus 1003 is applied to the other input of AND gate 1520. Similarly, the j-th bit of the combined data bus 1004 is applied to the other input of AND gate 1530. The outputs of the two AND gates 1520 and 1530 are applied to separate inputs of OR gate 1540. Dependent upon the state of the j-th bit of the transparency mask bus 1009, the output of OR gate 1540 corresponds either to the j-th bit of destination data bus 1003 or the j-th bit of combined data bus 1004. This output is the j-th bit of the data output of data output bus 1005. Thus, this j-th bit of the data output bus 1005 corresponds to the j-th bit of the destination data bus 1003 or the j-th bit of the combined data bus 1004 dependent upon the state of the j-th bit of the transparency mask bus 1009.

The present invention has been described in conjunction with a data word length of 16 bits. It would be clear to those skilled in the art that this disclosed data word length is not necessary to the practice of the present invention. So long as the permitted pixel sizes are all integral fractions of the selected data word length, the present invention would operate equally as well as described above.

I claim:

1. A linked cell detection apparatus for use in computer graphics applications comprising:
   an input bus for carrying a multibit input signal;
   a plurality of detection bit cells equal in number to the number of bits of said multibit input signal, each detection bit cell including,
      a circuit node for storing electric charge thereon,
      a precharge device connected to said circuit node for periodically storing a predetermined electrical charge on said circuit node,
      an output device having an output terminal and an input terminal connected to said circuit node for sensing the electric charge on said circuit node and generating an output signal at its output terminal indicative of the magnitude of said electric charge,
      conditional discharge means connected to said circuit node and having at least one input terminal, for controlling the discharging of the electric charge stored on said circuit node in response to a predetermined set of input signals on said at least one input terminal, at least one of said input signals being a corresponding bit of said multibit input bus, and
      a further discharge device connected to said circuit node and said output terminal of said output device for discharging the electrical charge stored on said circuit node when said output signal indicates a magnitude of electric charge stored on said circuit node less than a predetermined amount;
   a multibit output bus having corresponding bits connected to said output terminals of said output devices; and a plurality of selective coupling devices connected between said circuit nodes of a corresponding unique pair of said detection bit cells having an input terminal for receiving a signal that causes said coupling device to become conductive thereby connecting said circuit nodes of said corresponding pair of detection bit cells in response to a predetermined input signal on said input terminal.

2. A linked cell discharge detection apparatus as claimed in claim 1, wherein:
   each of said output devices of said detection bit cells further includes a blocking device connected to said precharge device for disabling said output device by casuing generation of a predetermined output signal on said output terminal during said peridoic storage of said predetermined electrical charge on said circuit node.

3. A linked cell discharge detection apparatus as claimed in claim 2, wherein:
   each said precharge device of said detection bit cells includes a field effect device having a source drain path coupled between a voltage source and said circuit node and a gate responsive to a clock signal, for connecting said volatge source to said circuit node during a predetermined active state of said clock signal; and
   each of said output devices of said detection bit cells includes an inverter having an input terminal connected to said gate of said field effect device of said precharge device and an output terminal, and a NOR gate having a first input terminal connected said output terminal of said inverter, a second input terminal connected to said circuit node and an output terminal forming said output terminal of said output device, whereby said NOR gate generates said predetermined output signal during said predetermined active state of said clock signal and generates an output signal corresponding the inverse of the magnitude of said electric charge stored on said cicrcuit node.

4. A linked cell discharge detection apparatus as claimed in claim 1, wherein:
   each of said further discharge device of said detection bit cells includes a field effect device having a source drain path coupled between said circuit node and ground, and a gate connected to said output terminal of said output device, whereby said field effect device discharges said electrical charge stored on said circuit node when said output signal indicates a magnitude of electric charge stored on said circuit node less than a predetermined amount.

5. A linked cell discharge detection apparatus as claimed in claim 1, wherein;
   each of said conditional discharge devices of said detection bit cells includes a plurality of field effect devices having gates connected to respective ones of said at least one input terminal and having respective source drain paths connected between said circuit node and ground, whereby said field effect devices discharge said electrical charge stored on said circuit node in response to said predetermined set of input signals on said at least one input terminal.

6. A linked cell discharge detection apparatus as claimed in claim 1, further comprising:
   each of the bits of said multibit output bus being connected to said input terminal of a corresponding selective coupling device;
   a set of logic devices connected to said multibit input bus and said multibit output bus for generating an output signal on said multibit output bus in response to signals on said multibit input bus whereby said detection bit cells are connected together in groups equal in number to the binary number represented by said multibit input bus.

7. A linked cell discharge detection apparatus as claimed in claim 6, further comprising:
   a register connected to said multibit input bus for storing a binary number corresponding to a data size.

8. A linked cell discharge detection apparatus as claimed in claim 1, wherein each of said selective coupling devices is a field effect device having a source to drain path coupled between a corresponding unique pair of said detection bit cells and having a gate for receiving said input signal for connecting said corresponding unique pair of said detection bit cells.

* * * * *